(12) United States Patent
Nishi et al.

(10) Patent No.: US 10,545,051 B2
(45) Date of Patent: Jan. 28, 2020

(54) EXPLOSIVE SPARK ESTIMATION SYSTEM AND EXPLOSIVE SPARK ESTIMATION METHOD

(71) Applicants: Fuji Jukogyo Kabushiki Kaisha, Tokyo (JP); Kyushu Institute of Technology, Kitakyushu-shi (JP)

(72) Inventors: Takayuki Nishi, Tokyo (JP); Shinya Ohtsuka, Kitakyushu (JP)

(73) Assignees: SUBARU CORPORATION, Tokyo (JP); KYUSHU INSTITUTE OF TECHNOLOGY, Kitakyushu-Shi, Fukuoka (JP)

( * ) Notice: Subject to any disclaimer, the term of this patent is extended or adjusted under 35 U.S.C. 154(b) by 0 days.

(21) Appl. No.: 15/246,284

(22) Filed: Aug. 24, 2016

(65) Prior Publication Data

US 2017/0059410 A1    Mar. 2, 2017

(30) Foreign Application Priority Data

Aug. 31, 2015   (JP) .................................. 2015-170339

(51) Int. Cl.
*G01J 3/443*   (2006.01)
*G01R 31/12*   (2006.01)
(Continued)

(52) U.S. Cl.
CPC .............. *G01J 3/443* (2013.01); *G01J 3/457* (2013.01); *G01R 31/1218* (2013.01); *G01J 2003/1213* (2013.01)

(58) Field of Classification Search
CPC .. G01J 3/443; G01J 3/2803; G01J 3/28; G01J 3/457; G01J 2003/2859; G01J 2003/1213; G01R 31/1218; G01R 31/1227
See application file for complete search history.

(56) References Cited

U.S. PATENT DOCUMENTS

RE21,750 E  *  3/1941  Starr ...................... F02M 69/00
                                                    123/255
2,298,468 A  * 10/1942  Curtis ...................... H01H 9/54
                                                    218/143
(Continued)

FOREIGN PATENT DOCUMENTS

EP          0318900 A2    6/1989
JP       2014-137227 A    7/2014
(Continued)

OTHER PUBLICATIONS

Extended European Search Report dated Feb. 22, 2017, issued in the European Patent Application No. 16 185 099.5.
(Continued)

*Primary Examiner* — Mohamed K Amara
(74) *Attorney, Agent, or Firm* — McGinn IP Law Group, PLLC

(57) ABSTRACT

According to one implementation, an explosive spark estimation system includes an explosive spark estimation system includes a measuring system and a processing system. The measuring system is adapted to measure intensity of light, included in a spark occurred from an object to be tested. The light is within at least one specific wavelength band. The processing system is adapted to determine whether the spark is explosiveness based on the intensity of the light. Further, according to one implementation, an explosive spark estimation method includes: measuring intensity of light, included in a spark occurred from an object to be tested, within at least one specific wavelength band; and determining whether the spark is explosive, based on the intensity of the light.

26 Claims, 4 Drawing Sheets

(51) Int. Cl.
*G01J 3/457* (2006.01)
*G01J 3/12* (2006.01)

(56) References Cited

U.S. PATENT DOCUMENTS

| | | | | |
|---|---|---|---|---|
| 2,975,278 | A * | 3/1961 | Brubaker | H01J 49/14 |
| | | | | 250/299 |
| 3,487,677 | A * | 1/1970 | Molitor | G01M 3/227 |
| | | | | 73/40.7 |
| 5,061,026 | A * | 10/1991 | Clarke | G01J 1/04 |
| | | | | 385/147 |
| 5,408,326 | A * | 4/1995 | Wang | G01N 21/255 |
| | | | | 250/576 |
| 5,544,693 | A * | 8/1996 | Begin | B22D 2/00 |
| | | | | 164/150.1 |
| 6,634,598 | B2 * | 10/2003 | Susko | B64D 37/32 |
| | | | | 137/209 |
| 6,750,597 | B1 * | 6/2004 | Sakura | H01T 13/20 |
| | | | | 313/141 |
| 7,385,692 | B1 * | 6/2008 | Nguyen | G01J 3/02 |
| | | | | 356/301 |
| 9,036,146 | B2 * | 5/2015 | Day | G01J 3/443 |
| | | | | 356/318 |
| 9,243,956 | B2 * | 1/2016 | Day | G01J 3/443 |
| 9,267,842 | B2 * | 2/2016 | Day | G01J 3/2823 |
| 9,360,367 | B2 * | 6/2016 | Day | G01J 3/443 |
| 9,435,742 | B2 * | 9/2016 | Day | G01N 21/718 |
| 9,565,419 | B2 * | 2/2017 | Presler | H04N 5/225 |
| 9,939,383 | B2 * | 4/2018 | Day | G01N 21/718 |
| 9,952,100 | B2 * | 4/2018 | Day | G01J 3/30 |
| 9,977,069 | B2 * | 5/2018 | Ohtsuka | G01R 31/1218 |
| 10,412,348 | B2 * | 9/2019 | Pool | H04N 7/183 |
| 2002/0101547 | A1 * | 8/2002 | Lee | G02F 1/136204 |
| | | | | 349/40 |
| 2002/0126278 | A1 * | 9/2002 | Olshausen | G01J 3/02 |
| | | | | 356/328 |
| 2003/0174325 | A1 * | 9/2003 | Zhang | G01J 3/443 |
| | | | | 356/318 |
| 2004/0113055 | A1 * | 6/2004 | Whelan | G01B 11/18 |
| | | | | 250/227.18 |
| 2006/0059922 | A1 * | 3/2006 | Anderson | B01D 5/0039 |
| | | | | 62/93 |
| 2007/0258090 | A1 | 11/2007 | Kwon et al. | |
| 2008/0022694 | A1 * | 1/2008 | Anderson | B01D 5/0072 |
| | | | | 62/3.4 |
| 2008/0212074 | A1 * | 9/2008 | Goulter | G01J 3/02 |
| | | | | 356/51 |
| 2009/0189773 | A1 * | 7/2009 | Hansen | G08B 17/12 |
| | | | | 340/577 |
| 2009/0294300 | A1 * | 12/2009 | Kanzius | B01D 1/0023 |
| | | | | 205/687 |
| 2010/0034349 | A1 * | 2/2010 | Kraus | G01N 21/67 |
| | | | | 378/41 |
| 2010/0181387 | A1 * | 7/2010 | Zaffaroni | A61M 15/06 |
| | | | | 239/13 |
| 2011/0228269 | A1 * | 9/2011 | Vincent | G01J 3/443 |
| | | | | 356/313 |
| 2014/0141679 | A1 * | 5/2014 | Kyuno | H01T 21/02 |
| | | | | 445/3 |
| 2014/0368818 | A1 * | 12/2014 | Demarco | G01J 3/0294 |
| | | | | 356/313 |
| 2016/0313291 | A1 * | 10/2016 | Johansen | G01N 33/0013 |
| 2016/0320361 | A1 * | 11/2016 | Johansen | G01N 21/3504 |

FOREIGN PATENT DOCUMENTS

| | | | |
|---|---|---|---|
| JP | 2014-153298 A | 8/2014 | |
| WO | WO-2019105678 A1 * | 6/2019 | G01N 21/67 |

OTHER PUBLICATIONS

Japanese Office Action dated Jun. 4, 2019, in Japanese Patent Application No. 2015-170339 with an English translation.

* cited by examiner

EXPLOSIVE SPARK ESTIMATION SYSTEM AND EXPLOSIVE SPARK ESTIMATION METHOD

CROSS REFERENCES TO RELATED APPLICATIONS

This application is based upon and claims the benefit of priority from Japanese Patent Application No. 2015-170339, filed on Aug. 31, 2015; the entire contents of which are incorporated herein by reference.

FIELD

Implementations described herein relate generally to an explosive spark estimation system and an explosive spark estimation method.

BACKGROUND

When electrical energy accumulates in a structure of an aircraft due to a lightning stroke, static electricity or the like, a spark occurs. The occurrence of a spark may cause fuel to ignite, which may interferes with the safety of a flight. Thus, conventionally in development of an aircraft, a huge number of tests have been done in order to confirm the existence of occurrence of a spark (for example, refer to Japanese Patent Application Publication JP 2014-153298 A). As a method of confirming the existence of occurrence of a spark, a photographic method and a gas ignition confirmation method are known.

The photographic method confirms the existence of a spark by photographing a test piece in which a current flows. Meanwhile, the gas ignition confirmation method confirms the existence of ignition by supplying a current to a test piece containing a flammable gas.

Furthermore, a technique to estimate energy of a spark has also been proposed as a related technique (for example, refer to Japanese Patent Application Publication JP 2014-137227 A).

In a spark confirmation test by the photographic method, even a spark having such a small energy that the spark does not ignite becomes a ground of rejection determination in the test as long as the spark is photographed. Therefore, an excessive countermeasure for preventing occurrence of a spark may be required. Furthermore, in the photographic method, there are problems that a spark may be photographed differently when cameras are different and that it may be unable to confirm the existence of a spark in the case of photographing a test piece having a complicated structure since a photographing direction of a camera is fixed.

Meanwhile, in the case of the gas ignition confirmation method, there are problems that a test piece may ignite due to other than a spark, that a test piece may not ignite even when a spark occurs, and that the test takes long time and safety measures are necessary.

The above-mentioned conventional spark confirmation test has incurred an increase in a development period of an aircraft, and also has become a factor for increasing development costs of an aircraft. This is a common issue not only in development of an aircraft but also in development of a product for which it is necessary to prevent occurrence of a spark having explosiveness.

Thus, an object of the present invention is to provide an explosive spark estimation system and an explosive spark estimation method which allow confirming the existence of occurrence of a spark having explosiveness, more safely and simply.

SUMMARY OF THE INVENTION

In general, according to one implementation, an explosive spark estimation system includes a measuring system and a processing system. The measuring system is adapted to measure intensity of light, included in a spark occurred from an object to be tested. The light is within at least one specific wavelength band. The processing system is adapted to determine whether the spark is explosiveness based on the intensity of the light.

Further, according to one implementation, an explosive spark estimation method includes: measuring intensity of light, included in a spark occurred from an object to be tested, within at least one specific wavelength band; and determining whether the spark is explosive, based on the intensity of the light.

DETAILED DESCRIPTION

An explosive spark estimation system and an explosive spark estimation method according to implementations of the present invention will be described with reference to the accompanying drawings.

(First Implementation)
(Configuration and Function)

Figure 1:
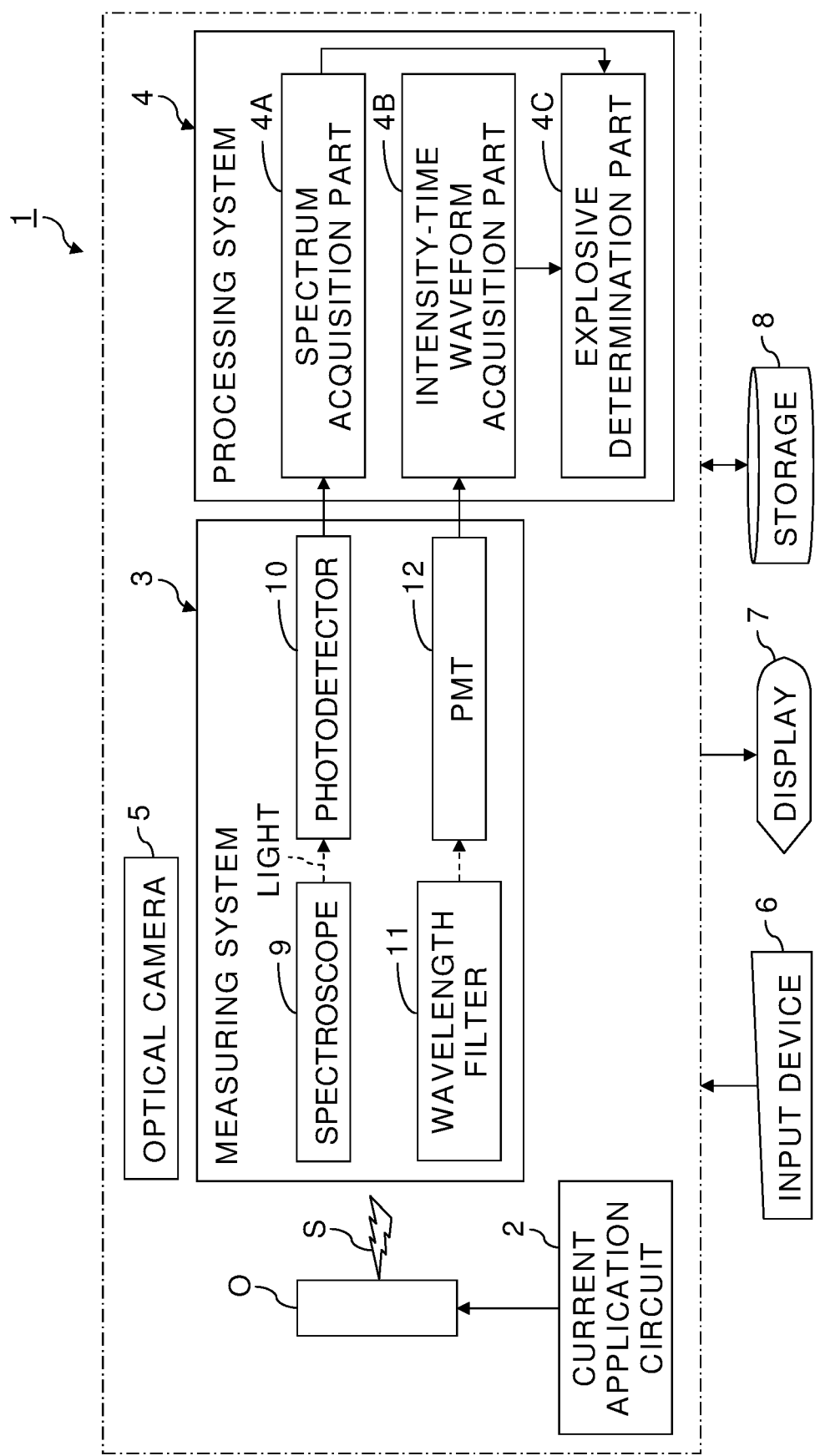
FIG. 1 is a configuration diagram of an explosive spark estimation system according to the first implementation of the present invention.

FIG. 1 is a configuration diagram of an explosive spark estimation system according to the first implementation of the present invention.

An explosive spark estimation system 1 determines whether at least one spark S occurred from an object O to be tested has explosiveness by igniting an inflammable material, such as aircraft fuel or flammable gas. For that purpose, the explosive spark estimation system 1 has a current application circuit 2, a measuring system 3, a processing system 4, an optical camera 5, an input device 6, a display 7, and a storage 8. The measuring system 3 measures light intensity in at least one specific wavelength band included in the spark S occurred from the object O to be tested. Meanwhile, the processing system 4 determines whether the spark S occurred from the object O to be tested is an explosive spark S, based on the light intensity in the specific wavelength band or the specific wavelength bands measured by the measuring system 3.

The measuring system 3 can be composed using a spectroscope 9, a photodetector 10, a wavelength filter 11, and a PMT (photomultiplier tube) 12, as exemplified in FIG. 1.

The spectroscope 9 is an optical device for inputting the spark S occurred from the object O to be tested and dispersing the input spark S. The spark S can be generated purposefully by supplying a current to the object O to be tested. Therefore, the current application circuit 2 for supplying a current is coupled to the object O to be tested.

The photodetector 10 is a light intensity sensor for detecting light intensity at least in a specific wavelength band or specific wavelength bands out of lights, having different wavelengths, dispersed by the spectroscope 9. Therefore, imaging elements, such as CCD (charged-coupled device) sensors or CMOS (complementary metal oxide semiconductor) sensors, arrayed at least in the wavelength direction of the dispersed lights, can be used as the photodetector 10.

The wavelength filter 11 is an optical element which inputs the spark S occurred from the object O to be tested, and extracts light in a specific wavelength band or lights in specific wavelength bands from the input spark S. The wavelength filter 11 for visible light is also called an optical color filter.

The PMT 12 is a highly-sensitive photodetector which detects intensity of light, in at least one specific wavelength band, extracted by the wavelength filter 11. The PMT 12 converts weak light in at least one specific wavelength band into an amplified electric signal and outputs the electric signal. Therefore, the PMT 12 can detect a time change in intensity of the light, which has transmitted the wavelength filter 11, in at least one specific wavelength band, as a time change in amplitude of an electric signal.

Note that, a photodetector other than the PMT 12 may also be used. Since intensity of light which occurs from the spark S is generally weak, it is practical to use the PMT 12 as a photodetector.

As described above, the measuring system 3 includes the first detection system in which the photodetector 10 detects light, having every wavelength, dispersed by the spectroscope 9, and the second detection system in which the PMT 12 detects intensity of light, which has transmitted the wavelength filter 11, in at least one specific wavelength band. Each output side of the photodetector 10 and the PMT 12 is coupled to the processing system 4. Note that, one of the first detection system and the second detection system may be omitted.

One end of an optical fiber may be disposed, for incidence of light, at a position where the spark S occurred from the object O to be tested can be made incident, and the spectroscope 9 may be coupled to the other end side of the optical fiber. In this case, the spectroscope 9 can be placed at a desired position. Thus, the spectroscope 9 can be disposed inside a shield box placed at a location far from the object O to be tested, in order to suppress noise. The similar applies to the second detection system composed of the wavelength filter 11 and the PMT 12.

The processing system 4 can be composed of a computer reading data processing program. That is, the processing system 4 can be composed of processing circuitry including a single electronic circuit or a plurality of electronic circuits as an element or elements.

More specifically, the processing system 4 can be implemented by circuitry including at least one semiconductor integrated circuit such as at least one processor (e.g., a central processing unit (CPU)), at least one application specific integrated circuit (ASIC), and/or at least one field programmable gate array (FPGA). At least one processor can be configured, by reading instructions from at least one machine readable tangible medium, to perform all or a part of functions of the processing system 4. Such a medium may take many forms, including, but not limited to, any type of magnetic medium such as a hard disk, any type of optical medium such as a compact disc (CD) and a digital versatile disk (DVD), any type of semiconductor memory (i.e., semiconductor circuit) such as a volatile memory and a non-volatile memory. The volatile memory may include a dynamic random access memory (DRAM) and a static random access memory (SRAM), and the nonvolatile memory may include a read-only memory (ROM) and a non-volatile random access memory (NVRAM). The ASIC is an integrated circuit (IC) customized to perform, and the FPGA is an integrated circuit designed to be configured after manufacturing in order to perform, all or a part of the functions of the modules shown in FIG. 1.

The processing system 4 includes a spectrum acquisition part 4A, an intensity-time waveform acquisition part 4B, and an explosive determination part 4C.

The spectrum acquisition part 4A has a function to input detected signals of light intensities, corresponding to wavelengths, from the photodetector 10, and obtain a light wavelength spectrum corresponding to the spark S. The intensity-time waveform acquisition part 4B has a function to input light intensity signals, converted into electric signals, from the PMT 12, and obtain an intensity-time waveform expressing a time change in relative intensity of light in at least one specific wavelength band. The explosive determination part 4C has a function to determine whether the spark S occurred from the object O to be tested is the explosive spark S, based on at least one of the light wavelength spectrum and the time change in the relative intensity of the spark light in the at least one specific wavelength band.

Figure 2:
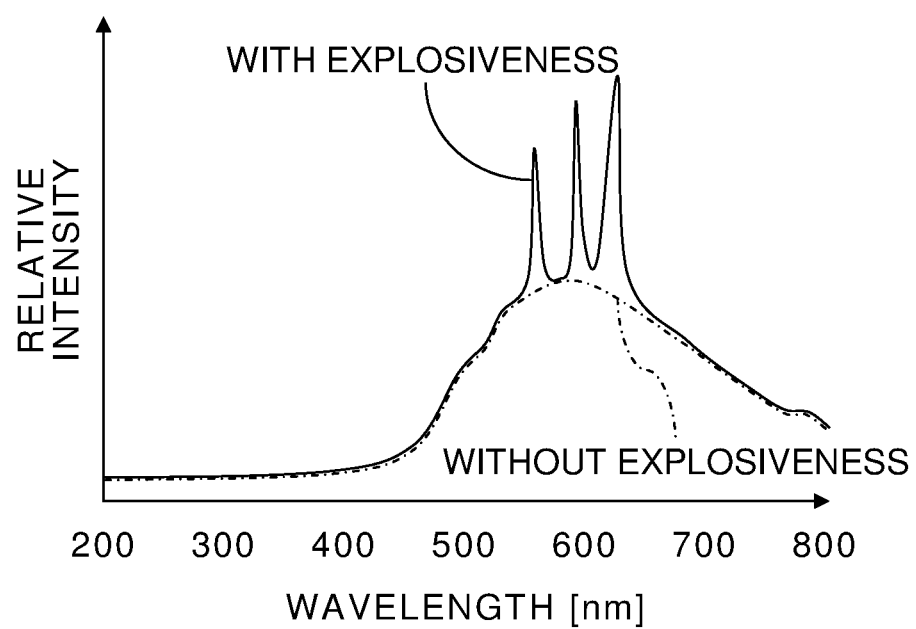
FIG. 2 shows an example of a light wavelength spectrum measured by dispersing the spark, occurred from the object to be tested, with the spectroscope.

FIG. 2 shows an example of a light wavelength spectrum measured by dispersing the spark S, occurred from the object O to be tested, with the spectroscope 9.

In FIG. 2, the horizontal axis shows light wavelength while the vertical axis shows relative intensity of light. A relationship between a waveform of a light wavelength spectrum and whether the spark S occurred from the object O to be tested has explosiveness was examined by tests. As a result, it became clear that the peaks appeared in the light wavelength spectrum in the specific wavelength bands, as shown in FIG. 2 when the spark S occurred from the object O to be tested had explosiveness due to igniting an inflammable material, such as fuel. That is, a relation that a spark S occurred from the object O to be tested was the explosive spark S when a peak appeared in a light wavelength spectrum in at least one of the specific wavelength bands was empirically confirmed.

More specifically, a relation that a spark S had explosiveness when a peak was observed in a wavelength spectrum in at least one wavelength band out of the first wavelength band of not less than 588 nm and not more than 591 nm, the second wavelength band of not less than 552 nm and not more than 555 nm, and the third wavelength band of not less than 619 nm and not more than 623 nm was confirmed. FIG. 2 shows an example in which the peak was observed in each of the first wavelength band of not less than 588 nm and not more than 591 nm, the second wavelength band of not less than 552 nm and not more than 555 nm, and the third wavelength band of not less than 619 nm and not more than 623 nm. In particular, it was also confirmed that the highest level peak appeared in the first wavelength band of not less than 588 nm and not more than 591 nm, in many cases when the spark S was the explosive spark S.

Therefore, the photodetector 10 of the measuring system 3 may measure light intensity in at least one wavelength band out of the first wavelength band of not less than 588 nm and not more than 591 nm, the second wavelength band of not less than 552 nm and not more than 555 nm, and the third wavelength band of not less than 619 nm and not more than 623 nm, without necessarily measuring light intensity in all wavelength bands. In that case, the explosive determination part 4C can simply determine whether a spark S is explosive, based on whether a peak has been detected in a light wavelength spectrum in at least one wavelength band.

Alternatively, the photodetector 10 of the measuring system 3 may measure light intensity in a wavelength band including at least the first wavelength band of not less than 588 nm and not more than 591 nm, the second wavelength band of not less than 552 nm and not more than 555 nm, and the third wavelength band of not less than 619 nm and not more than 623 nm, from a viewpoint of improving certainty of explosive determination. In this case, the explosive determination part 4C can determine that a spark S is explosive when a peak has been detected in a light wavelength spectrum in at least one of the first wavelength band, the second wavelength band, and the third wavelength band.

As described above, the explosive determination part 4C can determine that a spark S is explosive when a peak has been detected in a light wavelength spectrum in at least one specific wavelength band. As a method of automatically detecting a peak from a wavelength spectrum, a known and desired method can be adopted. As a specific example, the existence of a peak can be automatically determined by threshold processing of an area, the maximum value, a change rate, a differential value, or a fluctuation range of a wavelength spectrum in a specific wavelength band. The explosive determination part 4C can also automatically determine whether a spark S is explosive when the existence of a peak is automatically determined.

Note that, the explosive determination part 4C may display a waveform of a light wavelength spectrum in at least one specific wavelength band on the display 7 so that a user can determine the existence of a peak by a visual observation.

The explosive determination part 4C can also determine whether a spark S is explosive based on an amount of deviation between a light wavelength spectrum in a specific wavelength band and a light wavelength spectrum used as a benchmark, besides explosive estimation based on the existence of a peak.

In that case, a light wavelength spectrum corresponding to the minimum energy that gives explosiveness in the spark S is previously obtained as a light wavelength spectrum used as a benchmark. The obtained light wavelength spectrum used as a benchmark can be stored in the storage 8. Thus, a spark S, which is a target of an explosive determination test, can be determined to have explosiveness when an amount of deviation between a light wavelength spectrum in at least one specific wavelength band corresponding to the spark S and a reference light wavelength spectrum in case that the explosiveness appears in the spark S has become less than a threshold or not more than the threshold.

An amount of deviation between a light wavelength spectrum in a specific wavelength band corresponding to a spark S which is a target of an explosive determination test and a reference light wavelength spectrum in case that explosiveness occurs in the spark S can be expressed using a desired index, such as a difference in area, a square error, or a cross-correlation coefficient. Therefore, whether a spark S which is a target of an explosive determination test is explosive can be automatically determined by threshold processing of a desired index, such as a difference in area (integration value), a square error, or a cross-correlation coefficient between a wavelength spectrum in a specific wavelength band corresponding to the spark S and a reference wavelength spectrum.

As a matter of course, a representative value, such as an area or the maximal level, of a wavelength spectrum corresponding to a spark S which is a target of an explosive determination test may be used as a threshold and threshold processing of the representative value, such as an area or the maximal level, of the reference wavelength spectrum may be performed, instead of performing threshold processing of the amount of deviation. In that case, the spark S which is the target of the explosive determination test can be determined to have explosiveness when the representative value of the wavelength spectrum corresponding to the spark S which is the target of the explosive determination test has reached the representative value of the reference wavelength spectrum.

The sensitivity of the photodetector 10 may change according to observation conditions of a spark S, such as a relative positional relationship between the spark S and the photodetector 10. Thus, it is appropriate to perform a sensitivity correction of a reference wavelength spectrum. As a specific example, calibration of the photodetector 10 can be performed by detecting a spark S, which has transmitted a single monochromator or a plurality of monochromators, by the photodetector 10. Then, a light intensity signal can be normalized by dividing the light intensity signal by the maximum or the like of the light intensity signal. When the above-mentioned sensitivity correction of the photodetector 10 is performed, sensitivity dependence of the photodetector 10 can be removed, and explosive estimation of a spark S can be performed by comparing wavelength spectra, regardless of the observation conditions of the spark S.

As described above, the explosive determination part 4C of the processing system 4 can obtain a light wavelength spectrum, corresponding to a spark S which is a target of explosive estimation, from the spectrum acquisition part 4A, and automatically determine whether the spark S is a explosive spark S, based on whether a peak has been detected in the light wavelength spectrum in at least one specific wavelength band, or based on an amount of deviation between the light wavelength spectrum in the at least one specific wavelength band and a reference light wavelength spectrum.

Meanwhile, the explosive determination part 4C can obtain a light intensity-time waveform, in the at least one specific wavelength band corresponding to the spark S which is a target of explosive estimation, from the intensity-time waveform acquisition part 4B, and also automatically determine whether the spark S is a explosive spark S based on the light intensity-time waveform in the at least one specific wavelength band. The specific wavelength band which is an acquisition target of the light intensity-time waveform can be set to at least one of the first wavelength band of not less than 588 nm and not more than 591 nm, the second wavelength band of not less than 552 nm and not more than 555 nm, and the third wavelength band of not less than 619 nm and not more than 623 nm.

Explosive estimation of a spark S based on a light intensity-time waveform can be performed independently from explosive estimation of the spark S based on a wavelength spectrum. Therefore, only either the explosive estimation of the spark S based on the light intensity-time waveform or the explosive estimation of the spark S based on the wavelength spectrum may be performed. Note that, using both the explosive estimation of the spark S based on the light intensity-time waveform and the explosive estimation of the spark S based on the wavelength spectrum together can improve certainty of estimation.

A specific wavelength band which is an acquisition target of a light intensity-time waveform may be the same as a specific wavelength band which is an acquisition target of a wavelength spectrum, or may be different from the specific wavelength band which is the acquisition target of the wavelength spectrum. Therefore, the wavelength filter 11 and the PMT 12 of the measuring system 3 measure a time change in light intensity in a specific wavelength band which is a measuring target of the light intensity in the photodetector 10, or a time change in light intensity in another specific wavelength band. Thus, the wavelength filter 11 is an optical color filter which transmits the first wavelength band of not less than 588 nm and not more than 591 nm, the second wavelength band of not less than 552 nm and not more than 555 nm, or the third wavelength band of not less than 619 nm and not more than 623 nm. The measuring system 3 may also have the plural wavelength filters 11 and the plural PMTs 12 corresponding to wavelength bands so that light intensity-time waveforms can be obtained in plural specific wavelength bands out of the first wavelength band, the second wavelength band, and the third wavelength band.

Then, the explosive determination part 4C can determine whether a spark S is explosive, based on a waveform expressing a time change in light intensity, in a specific wavelength band or each of a plurality of specific wavelength bands, obtained by the intensity-time waveform acquisition part 4B.

More specifically, explosiveness of a spark S can be estimated by obtaining an integration value of a waveform expressing a time change in light intensity and comparing the integration value with a previously obtained threshold. The threshold compared with the integration value may be set to a representative value, such as an area or the like, of a waveform spectrum corresponding to the spark S having explosiveness and the minimum energy, or may also be set to an integration value of a waveform expressing a time change in intensity of light corresponding to the spark S having explosiveness and the minimum energy. The threshold compared with the integration value can also be stored in the storage 8.

Note that, it is desirable to perform a sensitivity correction of the photodetector 10 also for a reference waveform spectrum or an integration value of a reference waveform, compared with an integration value of a waveform expressing a time change in light intensity. In addition, it is desirable to perform a distance correction of light intensity detected by the PMT 12 in order to remove distance dependence between the PMT 12 and an occurrence position of a spark S. Since light intensity attenuates inversely with the square of a propagation distance of the light, the distance correction can be a correction which multiplies the light intensity by the square of the propagation distance of the light.

When a time change in light intensity is measured during an energizing period to the object O to be tested for generating a spark S, it can be recognized that at which timing luminescence intensity of the spark S has changed during the energizing period. Thus, a time change in light intensity may be displayed on the display 7 so that a user can observe the time change in the light intensity.

The optical camera 5 is an image sensor, such as a digital camera, for photographing a spark S occurred from the object O to be tested. An image of spark S photographed by the optical camera 5 can be displayed on the display 7. Thus, a user can confirm an occurrence position of the spark S by observing the image displayed on the display 7.

(Operation and Action)

Next, an explosive spark estimation method using the explosive spark estimation system 1 will be described.

Figure 3:
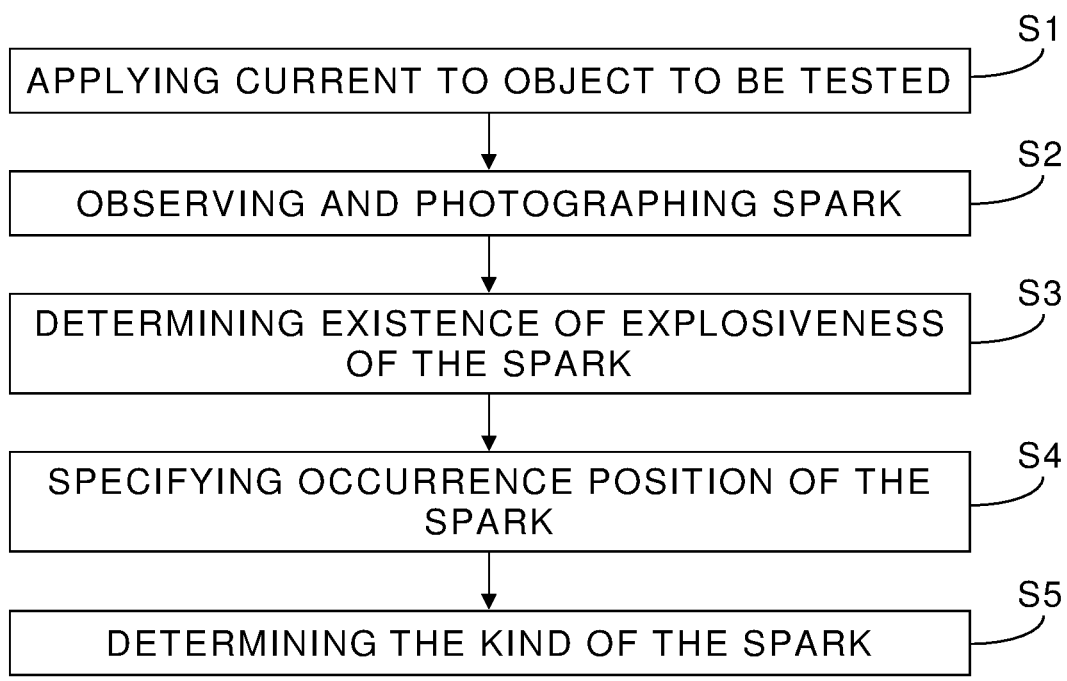
FIG. 3 is a flow chart showing a flow of an explosive spark estimation method of a spark, occurred from an object to be tested, using the explosive spark estimation system shown in FIG. 1.

FIG. 3 is a flow chart showing a flow of an explosive spark estimation method of a spark S, occurred from an object O to be tested, using the explosive spark estimation system 1 shown in FIG. 1.

Firstly, in step S1, current is applied to the object O to be tested, from the current application circuit 2. Thereby, a spark S occurs from the object O to be tested.

Next, in step S2, the spark S occurred from the object O to be tested is observed. Specifically, intensity of light in at least one specific wavelength band, generated by the spark S occurred from the object O to be tested, is measured by the measuring system 3. More specifically, intensity of light in at least one specific wavelength band out of light for every wavelength dispersed by the spectroscope 9 is detected by the photodetector 10, such as CCD sensors or CMOS sensors. Furthermore, time series intensity of light in a specific wavelength band, which has transmitted the wavelength filter 11, is detected by the PMT 12. Meanwhile, the spark S occurred from the object O to be tested is photographed by the optical camera 5.

Next, in step S3, it is determined whether the spark S is an explosive spark based on the measured light intensity. The explosive determination of the spark S can be performed based on one or both of the light intensities corresponding to wavelengths detected by the photodetector 10 and the time series signal of the light intensity detected by the PMT 12.

In the case of performing the explosive determination of the spark S based on the light intensities corresponding to wavelengths detected by the photodetector 10, a light wavelength spectrum in at least a specific wavelength band is obtained by the spectrum acquisition part 4A of the processing system 4. Then, when a peak has been confirmed in the light wavelength spectrum in the specific wavelength band by the explosive determination part 4C, the spark S is determined to be explosive. Alternatively, the light wavelength spectrum in the specific wavelength band may be displayed on the display 7 and the spark S may be determined to be explosive when a user has confirmed a peak in the light wavelength spectrum in the specific wavelength band by a visual observation.

As another method, whether the spark S is explosive may be determined automatically or by a visual observation by comparing the light wavelength spectrum in the specific wavelength band with a reference light wavelength spectrum which has previously been obtained and stored in the storage 8. When the explosive determination part 4C performs the explosive determination of the spark S automatically, for example, threshold processing which compares representative values of the two wavelength spectra may be performed. Meanwhile, when a user performs the explosive determination of the spark S by a visual observation, a difference value of the two wavelength spectra may be displayed on the display 7, or the two wavelength spectra may be superimposed and displayed identifiably on the display 7.

As a specific example, when light intensity in at least one wavelength band out of the first wavelength band of not less than 588 nm and not more than 591 nm, the second wavelength band of not less than 552 nm and not more than 555 nm, and the third wavelength band of not less than 619 nm and not more than 623 nm has been measured by the photodetector 10, whether the spark S is explosive can be determined based on whether a peak has been detected in a light wavelength spectrum in the at least one wavelength band or an amount of deviation between the light wavelength spectrum in the at least one wavelength band and a reference light wavelength spectrum.

Alternatively, when light intensity in a wavelength band including at least the first wavelength band of not less than 588 nm and not more than 591 nm, the second wavelength band of not less than 552 nm and not more than 555 nm, and the third wavelength band of not less than 619 nm and not more than 623 nm has been measured by the photodetector 10, it can be determined that the spark S is explosive when a peak has been detected in a light wavelength spectrum in at least one of the first wavelength band, the second wavelength band, and the third wavelength band. As a matter of course, a light wavelength spectrum in each of the first wavelength band, the second wavelength band, and the third wavelength band may be compared with a reference wavelength spectrum, and it may be determined that the spark S is explosive when an amount of deviation in at least one wavelength band has become not more than a threshold or less than the threshold.

Meanwhile, in the case of performing the explosive determination of the spark S based on a time series signal of light intensity detected by the PMT 12, a light intensity-time waveform in a specific wavelength band corresponding to the spark S is obtained by the intensity-time waveform acquisition part 4B of the processing system 4. Then, it can be automatically determined whether the spark S is explosive by comparing the light intensity-time waveform in the specific wavelength band corresponding to the spark S with a threshold, in the explosive determination part 4C. Alternatively, the light intensity-time waveform in the specific wavelength band corresponding to the spark S may be displayed on the display 7 with a reference waveform or a reference level so that a user can determine whether the spark S is explosive by a visual observation.

Then, when the spark S has been determined not to be explosive, a test result of the object O can be considered as pass. Meanwhile, when the spark S has been determined to be explosive, it becomes important to recognize an occurrence position and the kind of the spark S.

In that case, in step S4, an occurrence position of the spark S is specified based on a photographing result of the spark S by the optical camera 5. An image of the spark S photographed by the optical camera 5 is displayed on the display 7. Thereby, the user can confirm an occurrence position of the spark S by observing the image. A position where the spark S has occurred may also be automatically detected by image processing, such as threshold processing of pixel values.

Next, in step S5, the kind of spark S is determined based on the occurrence position of the spark S. Examples of the kind of the spark S include a voltage spark, a thermal spark, and an edge glow of a composite material. A voltage spark occurs due to a potential difference generated by static electricity or a stroke of lightning. A thermal spark is caused by heat accumulating in a composite material. An edge glow occurs due to an increase in an electric charge at an end portion of a composite material.

Thus, a portion, at which the spark S has occurred, of the object O can be specified based on the occurrence position of the spark S. Then, it can be determined whether the kind of the spark S is any one of a voltage spark, a thermal spark, and an edge glow of a composite material, by confirming the portion, at which the spark S has occurred, of the object O.

For example, when the portion at which the spark S has occurred is a composite material, the spark S can be determined to be a thermal spark. Meanwhile, when the portion at which the spark S has occurred is between metal parts, the spark S can be determined to be a voltage spark. Furthermore, when the portion at which the spark S has occurred is an edge of a composite material, the spark S can be determined to be an edge glow of the composite material.

Thus, the explosive spark estimation system 1 and the explosive spark estimation method as described above perform explosive estimation of a spark S based on light intensity in at least one specific wavelength band of a wavelength spectrum, using an observation result that a peak appears in the specific wavelength band when the spark S has explosiveness.

(Effects)

Accordingly, the explosive spark estimation system 1 and the explosive spark estimation method allow estimating the existence of explosiveness of a spark S simply and quantitatively. Furthermore, explosive estimation of a spark S can be performed in the air without a flammable gas. For example, it can be confirmed by a test in the air whether an occurred spark S causes an explosion in an atmosphere in a fuel tank. Thereby, it can be determined safely whether a spark S occurred due to a lightning stroke, static electricity or the like ignites a flammable substance, such as fuel.

Conversely, explosive estimation of a spark S by the explosive spark estimation system 1 and the explosive spark estimation method can also be performed in a flammable gas atmosphere. In that case, when a spark S has occurred but not exploded, it can be presumed that the reason why the spark S has not exploded is because energy of the spark S was small, by determining whether a peak appeared in a wavelength spectrum or the like.

In addition, the explosive spark estimation system 1 and the explosive spark estimation method allow determining even a test piece for a lightning stroke test or the like, which has conventionally been rejected uniformly when a spark S occurs, as pass so long as the spark S does not have explosiveness. That is, specifications of a lightning stroke test or the like can be changed into more efficient specifications. As a result, test time and test costs can be reduced.

In particular, when a structure of an aircraft is the object O to be tested, a composite material, such as GFRP (glass fiber reinforced plastics) or CFRP (carbon fiber reinforced plastics), is used as a material in many cases. In such a case, a spark S can be generated by applying a current to the object O to be tested including a composite material and whether the spark S occurred from the composite material is explosive can be determined.

As a matter of course, not only limited to a lightning stroke test or the like of an aircraft, explosive estimation of a spark S can be performed for a desired object O which is used in a state where a composite material, such as CFRP, is connected with a metal member. For example, explosive estimation of a spark S can also be performed in the case that a high current has flowed due to a stroke of lightning to or an accident in a fuel tank of a car, a motorbike, a ship, a robot or the like.

(Second Implementation)

Figure 4:
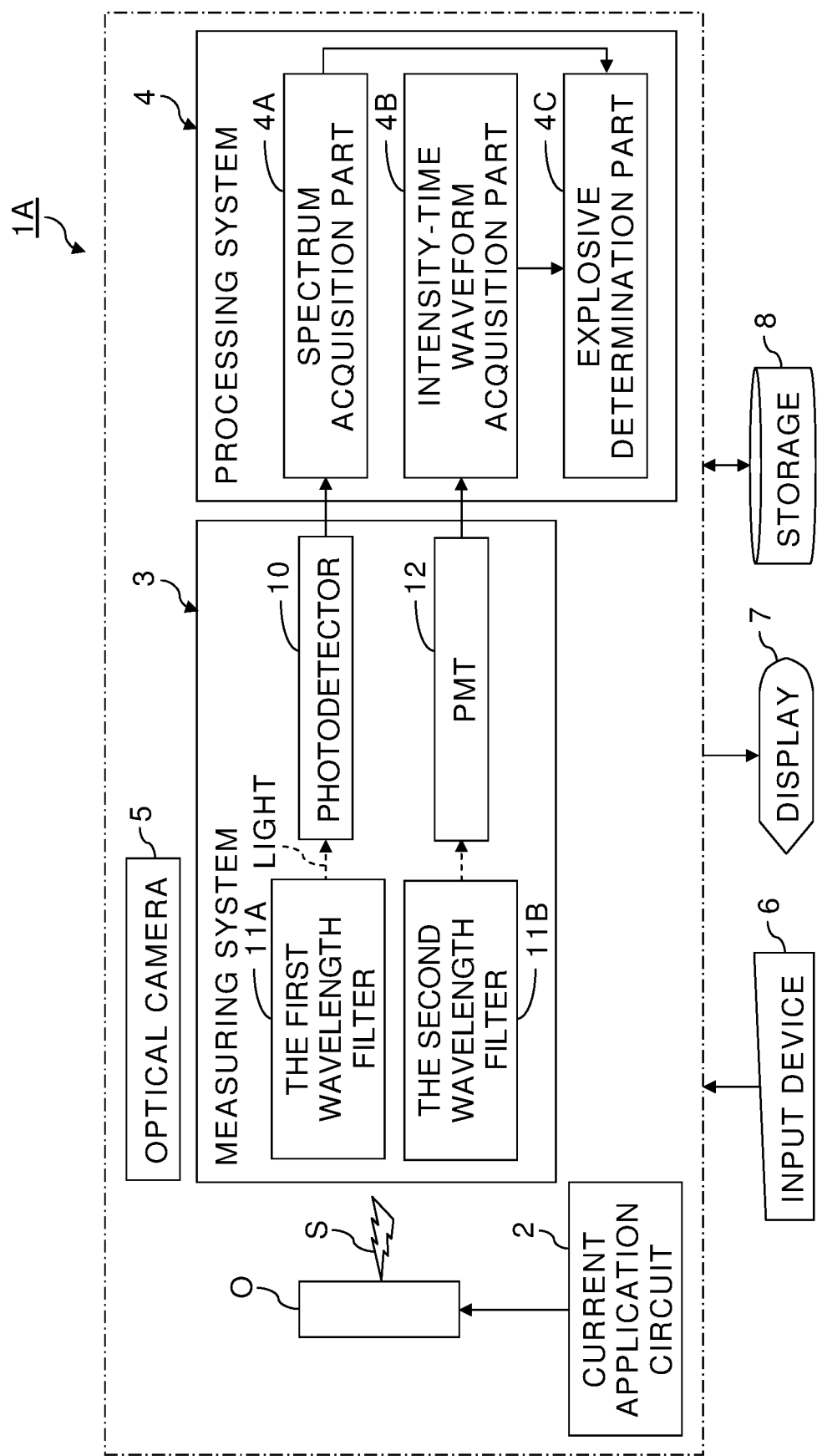
FIG. 4 is a configuration diagram of an explosive spark estimation system according to the second implementation of the present invention.

FIG. 4 is a configuration diagram of an explosive spark estimation system according to the second implementation of the present invention.

An explosive spark estimation system 1A in the second implementation shown in FIG. 4 is different from the explosive spark estimation system 1 in the first implementation in the configuration that the spectroscope 9 has been replaced by a wavelength filter 11A. Other configurations and functions of the explosive spark estimation system 1A in the second implementation are not substantially different from those of the explosive spark estimation system 1 in the first implementation. Therefore, the same elements or corresponding elements are shown by the same signs, and their explanations are omitted.

Specifically, the measuring system 3 of the explosive spark estimation system 1A includes the first wavelength filter 11A for inputting light in a specific wavelength band to the photodetector 10 and the second wavelength filter 11B for transmitting light in a specific wavelength band to input the light in the PMT 12.

When a specific wavelength band, in which the existence of a peak should be determined from a light wavelength spectrum, has been defined, the existence of the peak can be determined as long as a wavelength spectrum is obtained only for at least the specific wavelength band. Therefore, only a wavelength spectrum of light in a specific wavelength band which has transmitted the first wavelength filter 11A may be obtained instead of obtaining a wavelength spectrum by dispersing light in the whole wavelength band by the spectroscope 9.

In the case of determining the existence of a peak in each of wavelength spectra in plural wavelength bands, what is necessary is to use a variable filter as the first wavelength filter 11A. Alternatively, the measuring system 3 may include sets of the first wavelength filter 11A and the photodetector 10, which transmit lights in different wavelength bands and detect the transmitted lights.

The explosive spark estimation system 1A in the second implementation can achieve an advantage that peak detection processing from a wavelength spectrum can be made unnecessary, in addition to the effects similar to those of the explosive spark estimation system 1 in the first implementation. Specifically, whether a spark S occurred from the object O to be tested is explosive can be determined only by simply comparing a level of the maximum value of light intensity or an area of a curve expressing light intensity, in a limited wavelength band, with a threshold. Therefore, explosive estimation of a spark S becomes easy not only when the explosive estimation of the spark S is performed automatically, but also when a user performs the explosive estimation of the spark S by a visual observation.

(Other Implementations)

While certain implementations have been described, these implementations have been presented by way of example only, and are not intended to limit the scope of the invention. Indeed, the novel methods and systems described herein may be embodied in a variety of other forms; furthermore, various omissions, substitutions and changes in the form of the methods and systems described herein may be made without departing from the spirit of the invention. The accompanying claims and their equivalents are intended to cover such forms or modifications as would fall within the scope and spirit of the invention.

For example, each of the above-mentioned implementations has shown a case premised on the observation result that when a spark S has explosiveness, a light wavelength spectrum has a peak in at least one of the first wavelength band of not less than 588 nm and not more than 591 nm, the second wavelength band of not less than 552 nm and not more than 555 nm, and the third wavelength band of not less than 619 nm and not more than 623 nm. When a material of the object O to be tested and/or occurring circumstances of a spark S remarkably differ from those in the above-mentioned case, a possibility that a peak is observed in a different wavelength band cannot be denied. Therefore, when such an observation result has been obtained, functions of an explosive spark estimation system can be determined on the premise that a peak appears in a wavelength band depending on the observation result. The similar applies to an explosive spark estimation method.

What is claimed is:

1. An explosive spark estimation system comprising:
    a measuring system comprising:
        at least one of a spectroscope that disperses light in a spark from an object to be tested, and a wavelength filter that extracts light in the spark from the object to be tested; and
        a photodetector that measures intensity of light from the at least one of the spectroscope and the wavelength filter, the light being within a specific wavelength band in which a peak appears in a wavelength spectrum of the light when the spark is explosive due to igniting an inflammable material; and
    a processing circuitry that at least one of:
        determines the spark to be explosive if a peak is detected in the wavelength spectrum of the light in the specific wavelength band, and nonexplosive if the peak is not detected;
        determines the spark to be explosive if an amount of deviation between the wavelength spectrum of the light and a reference wavelength spectrum in the specific wavelength band indicates the spark is explosive, and nonexplosive if the amount of deviation indicates the spark is nonexplosive; and
        determines the spark to be explosive if a value of the measured light intensity of the light in the specific wavelength band indicates the spark is explosive, and nonexplosive if the value indicates the spark is nonexplosive.

2. The explosive spark estimation system according to claim 1,
    wherein the processing circuitry is adapted to determine that the spark is explosive when a peak has been detected in a wavelength spectrum of the light in the specific wavelength band.

3. The explosive spark estimation system according to claim 2,
    wherein the specific wavelength band comprises at least a first wavelength band within not less than 588 nm and not more than 591 nm, a second wavelength band within not less than 552 nm and not more than 555 nm, and a third wavelength band within not less than 619 nm and not more than 623 nm; and
    the processing circuitry is adapted to determine that the spark is explosive when a peak has been detected in a wavelength spectrum of light in at least one of the first wavelength band, the second wavelength band, and the third wavelength band.

4. The explosive spark estimation system according to claim 2,
    wherein the measuring system comprises the spectroscope adapted to input the spark occurred from the object to be tested and disperse the spark; and
    the photodetector is adapted to detect the intensity of the light in the specific wavelength band, dispersed by the spectroscope.

5. The explosive spark estimation system according to claim 2,
    wherein the measuring system comprises the wavelength filter adapted to extract the light in the specific wavelength band from the spark occurred from the object to be tested; and the photodetector is adapted to detect the intensity of the light in the specific wavelength band, extracted by the wavelength filter.

6. The explosive spark estimation system according to claim 1,
wherein the processing circuitry is adapted to determine whether the spark is explosive, based on an amount of deviation between a wavelength spectrum of the light in the specific wavelength band and a reference wavelength spectrum of light.

7. The explosive spark estimation system according to claim 6,
wherein the measuring system comprises the spectroscope adapted to input the spark occurred from the object to be tested and disperse the spark; and
the photodetector is adapted to detect the intensity of the light in the specific wavelength band, dispersed by the spectroscope.

8. The explosive spark estimation system according to claim 6,
wherein the measuring system comprises the wavelength filter adapted to extract the light in the specific wavelength band from the spark occurred from the object to be tested; and
the photodetector is adapted to detect the intensity of the light in the specific wavelength band, extracted by the wavelength filter.

9. The explosive spark estimation system according to claim 1,
wherein the specific wavelength band comprises at least one of a first wavelength band within not less than 588 nm and not more than 591 nm, a second wavelength band within not less than 552 nm and not more than 555 nm, and a third wavelength band within not less than 619 nm and not more than 623 nm; and
the processing circuitry is adapted to determine whether the spark is explosive based on whether a peak has been detected in a wavelength spectrum of light in the at least one of the first wavelength band, the second wavelength band, and the third wavelength band, or based on an amount of deviation between a reference wavelength spectrum of light and the wavelength spectrum of the light in the at least one of the first wavelength band, the second wavelength band, and the third wavelength band.

10. The explosive spark estimation system according to claim 1,
wherein the specific wavelength band comprises at least a first wavelength band within not less than 588 nm and not more than 591 nm, a second wavelength band within not less than 552 nm and not more than 555 nm, and a third wavelength band within not less than 619 nm and not more than 623 nm; and
the processing circuitry is adapted to determine that the spark is explosive when a peak has been detected in a wavelength spectrum of light in at least one of the first wavelength band, the second wavelength band, and the third wavelength band.

11. The explosive spark estimation system according to claim 1,
wherein the measuring system comprises the spectroscope adapted to input the spark occurred from the object to be tested and disperse the spark; and
the photodetector is adapted to detect the intensity of the light in the specific wavelength band, dispersed by the spectroscope.

12. The explosive spark estimation system according to claim 1,
wherein the measuring system comprises the wavelength filter adapted to extract the light in the specific wavelength band from the spark occurred from the object to be tested; and
the photodetector is adapted to detect the intensity of the light in the specific wavelength band, extracted by the wavelength filter.

13. The explosive spark estimation system according to claim 12,
wherein the measuring system is adapted to measure a time change in the intensity of the light in the at least one specific wavelength band or intensity of light in another specific wavelength band; and
the processing circuitry is adapted to determine whether the spark is explosive, based on a waveform expressing the time change.

14. The explosive spark estimation system according to claim 1, wherein the wavelength filter extracts light in the specific wavelength band from the light of the spark from the object to be tested.

15. The explosive spark estimation system according to claim 1, wherein the photodetector does not measure light intensity for the light of the spark which is outside of the specific wavelength band.

16. The explosive spark estimation system according to claim 1, wherein the specific wavelength band comprises a plurality of specific wavelength bands, and the processing circuitry determines whether the spark is explosive based on a characteristic of the measured intensity of the light in each of the plurality of specific wavelength bands.

17. The explosive spark estimation system according to claim 1, wherein after the processing circuitry determines whether the spark is explosive, the processing circuitry determines an occurrence position of the spark.

18. The explosive spark estimation system according to claim 1, wherein the processing circuitry:
compares a characteristic of the measured intensity of the light in the specific wavelength band to a reference characteristic; and
determines whether the spark is explosive based on the comparison.

19. An explosive spark estimation method comprising:
at least one of dispersing light in a spark from an object to be tested, and extracting light in the spark from the object to be tested; and
measuring intensity of light comprising at least one of the dispersed light and the extracted light, the light being within a specific wavelength band in which a peak appears in a wavelength spectrum of the light when the spark is explosive due to igniting an inflammable material; and
at least one of:
determining the spark to be explosive if a peak detected in the wavelength spectrum of the light in the specific wavelength band, and nonexplosive if the peak is not detected;
determining the spark to be explosive if an amount of deviation between the wavelength spectrum of the light and a reference wavelength spectrum in the specific wavelength band indicates the spark is explosive, and nonexplosive if the amount of deviation indicates the spark is nonexplosive; and
determining the spark to be explosive if a value of the measured light intensity of the light in the specific wavelength band indicates the spark is explosive, and nonexplosive if the value indicates the spark is nonexplosive.

20. The explosive spark estimation method according to claim 19, further comprising:
    photographing the spark by an optical camera and specifying an occurrence position of the spark, based on a result of the photographing.

21. The explosive spark estimation method according to claim 20, wherein the kind of the spark is determined based on the occurrence position of the spark.

22. The explosive spark estimation method according to claim 19,
    wherein the object to be tested includes a composite material; and
    the spark is occurred from the composite material by supplying a current to the object to be tested.

23. The explosive spark estimation method according to claim 19,
    wherein the spark is determined to be explosive when a peak has been confirmed in a wavelength spectrum of the light in the specific wavelength band.

24. The explosive spark estimation method according to claim 19,
    wherein the specific wavelength band includes at least one of a first wavelength band within not less than 588 nm and not more than 591 nm, a second wavelength band within not less than 552 nm and not more than 555 nm, and a third wavelength band within not less than 619 nm and not more than 623 nm; and
    whether the spark is explosive is determined based on whether a peak has been detected in a wavelength spectrum of the light in the at least one of the first wavelength band, the second wavelength band, and the third wavelength band, or based on an amount of deviation between a reference wavelength spectrum of light and the wavelength spectrum of the light in the at least one of the first wavelength band, the second wavelength band, and the third wavelength band.

25. The explosive spark estimation method according to claim 19,
    wherein the specific wavelength band includes at least a first wavelength band within not less than 588 nm and not more than 591 nm, a second wavelength band within not less than 552 nm and not more than 555 nm, and a third wavelength band within not less than 619 nm and not more than 623 nm; and
    the spark is determined to be explosive when a peak has been confirmed in a wavelength spectrum of light in at least one of the first wavelength band, the second wavelength band, and the third wavelength band.

26. An explosive spark estimation system comprising:
    a measuring system comprising:
        a first detection system comprising:
            a spectroscope that disperses light in a spark from an object to be tested; and
            a first photodetector that measures intensity of the light dispersed by the spectroscope, the dispersed light being within a specific wavelength band;
        a second detection system comprising:
            a wavelength filter that extracts light in the spark from the object to be tested; and
            a second photodetector that measures intensity of the light extracted by the wavelength filter, the extracted light being within the specific wavelength band; and
    a processing circuitry that at least one of:
        determines the spark to be explosive if a peak is detected in the wavelength spectrum of the light in the specific wavelength band, and nonexplosive if the peak is not detected;
        determines the spark to be explosive if an amount of deviation between the wavelength spectrum of the light and a reference wavelength spectrum in the specific wavelength band indicates the spark is explosive, and nonexplosive if the amount of deviation indicates the spark is nonexplosive; and
        determines the spark to be explosive if a value of the measured light intensity of the light in the specific wavelength band indicates the spark is explosive, and nonexplosive if the value indicates the spark is nonexplosive.

\* \* \* \* \*